(12) United States Patent
Sun et al.

(10) Patent No.: US 9,240,469 B2
(45) Date of Patent: Jan. 19, 2016

(54) TRANSVERSE ULTRA-THIN INSULATED GATE BIPOLAR TRANSISTOR HAVING HIGH CURRENT DENSITY

(71) Applicant: SOUTHEAST UNIVERSITY, Jiangu (CN)

(72) Inventors: Weifeng Sun, Jiangsu (CN); Jing Zhu, Jiangsu (CN); Shen Xu, Jiangsu (CN); Qinsong Qian, Jiangsu (CN); Siyang Liu, Jiangsu (CN); Shengli Lu, Jiangsu (CN); Longxing Shi, Jiangsu (CN)

(73) Assignee: SOUTHEAST UNIVERSITY, Jiangu (CN)

( * ) Notice: Subject to any disclaimer, the term of this patent is extended or adjusted under 35 U.S.C. 154(b) by 0 days.

(21) Appl. No.: 14/439,715

(22) PCT Filed: Dec. 27, 2012

(86) PCT No.: PCT/CN2012/087710
§ 371 (c)(1),
(2) Date: Apr. 30, 2015

(87) PCT Pub. No.: WO2014/071673
PCT Pub. Date: May 15, 2014

(65) Prior Publication Data
US 2015/0270377 A1      Sep. 24, 2015

(30) Foreign Application Priority Data

Nov. 7, 2012   (CN) .......................... 2012 1 0442085

(51) Int. Cl.
*H01L 29/66* (2006.01)
*H01L 29/739* (2006.01)
(Continued)

(52) U.S. Cl.
CPC .......... *H01L 29/7394* (2013.01); *H01L 23/528* (2013.01); *H01L 29/0611* (2013.01);
(Continued)

(58) Field of Classification Search
CPC ............ H01L 29/7394; H01L 29/0611; H01L 29/0696; H01L 29/0808; H01L 29/0821; H01L 29/0847; H01L 29/1008; H01L 29/4916

USPC ........................................................ 257/141
See application file for complete search history.

(56) References Cited

U.S. PATENT DOCUMENTS

| 5,933,734 | A  |   | 8/1999 | Ferla et al. |
| 6,365,932 | B1 | * | 4/2002 | Kouno ................ H01L 27/0255 257/133 |
| 2004/0046226 | A1 | * | 3/2004 | Himi ........................ H01L 21/84 257/499 |

FOREIGN PATENT DOCUMENTS

| CN | 101969050 A | 2/2011 |
| JP | 2005093696 A | 4/2005 |

OTHER PUBLICATIONS

Chinese version of the International Search Report for related PCT Application No. PCT/CN2012/087710 mailed Aug. 15, 2013.

(Continued)

*Primary Examiner* — Trung Q Dang
(74) *Attorney, Agent, or Firm* — Troutman Sanders LLP; James E. Schutz; Lei Fang

(57) ABSTRACT

A transverse ultra-thin insulated gate bipolar transistor having current density includes: a P substrate, where the P substrate is provided with a buried oxide layer thereon, the buried oxide layer is provided with an N epitaxial layer thereon, the N epitaxial layer is provided with an N well region and P base region therein, the P base region is provided with a first P contact region and an N source region therein, the N well region is provided with an N buffer region therein, the N well region is provided with a field oxide layer thereon, the N buffer region is provided with a P drain region therein, the N epitaxial layer is provided therein with a P base region array including a P annular base region, the P base region array is located between the N well region and the P base region, the P annular base region is provided with a second P contact region and an N annular source region therein, and the second P contact region is located in the N annular source region. The present invention greatly increases current density of a transverse ultra-thin insulated gate bipolar transistor, thus significantly improving the performance of an intelligent power module.

6 Claims, 4 Drawing Sheets

(51) Int. Cl.
| | |
|---|---|
| *H01L 29/06* | (2006.01) |
| *H01L 29/49* | (2006.01) |
| *H01L 29/10* | (2006.01) |
| *H01L 29/08* | (2006.01) |
| *H01L 23/528* | (2006.01) |

(52) U.S. Cl.
CPC ........ *H01L29/0696* (2013.01); *H01L 29/0808* (2013.01); *H01L 29/0821* (2013.01); *H01L 29/0847* (2013.01); *H01L 29/1008* (2013.01); *H01L 29/4916* (2013.01)

(56) References Cited

OTHER PUBLICATIONS

Translated version of the International Search Report for related PCT Application No. PCT/CN/2012/087710 mailed Aug. 15, 2013.

\* cited by examiner

TRANSVERSE ULTRA-THIN INSULATED GATE BIPOLAR TRANSISTOR HAVING HIGH CURRENT DENSITY

CROSS-REFERENCE TO RELATED APPLICATIONS

This application is a US National Stage of International Application No. PCT/CN2012/087710, filed 27 Dec. 2012, which claims the benefit of a Chinese Application No. CN20101442085.X, filed 7 Nov. 2012, the entire content of which is fully incorporated by reference herein.

FIELD OF THE INVENTION

The present invention relates to power semiconductor devices, and in particular, to a transverse ultra-thin insulated gate bipolar transistor (IGBT) having current density that is integrated on an ultra-thin process platform.

DESCRIPTION OF RELATED ART

Intelligent power modules in high-voltage power integrated circuits can be applied to various fields, for example, driving and controlling various industrial and civil single-phase and three-phase motors. A power switch element in an intelligent power module is a key part in the entire intelligent power module. As a power switch element, an IGBT not only is characterized by a high working speed, large input impedance, and a simple driving circuit of a MOSFET, but also has an advantage of a large current carrying capacity of a bipolar transistor. Therefore, during recent years, IGBTs are frequently used in power integrated circuits. In IGBTs, the L-IGBT attracts our attention as it is suitable to be integrated in a high-density integrated circuit. A large-capacity current output capability is very important in power devices. However, for an ultra-thin L-IGBT, it is very difficult to improve the current density as a conductivity modulation effect is not obvious enough. How to obtain a large current and a high breakdown voltage at a source end and a drain end of the ultra-thin L-IGBT becomes the key to improve the performance of the entire integrated circuit. Therefore, how the ultra-thin L-IGBT functioning as a power switch element obtains high current density undoubtedly is important content of an intelligent power module circuit and process research.

There are already various current density increasing methods for existing L-IGBTs. In the current density increasing methods, a most effective and prominent one is to increase current density of a thick-film L-IGBT in a dual channel manner, which is mentioned in the U.S. Pat. No. 5,731,603 of Toshiba Corporation. In the structure, a P base region has an N epitaxial layer on both sides. Therefore, after a conducting channel is formed on two sides of an N source region, the N epitaxial layer can provide a current flow path. However, in an ultra-thin-film structure, a P base region easily extends to a buried oxide layer below and thus causes an N epitaxial layer that can provide a current flow path to be pinched off. Therefore, the current density increasing method mentioned in the U.S. Pat. No. 5,731,603 is impracticable in the ultra-thin structure.

SUMMARY OF THE INVENTION

Technical Problem

The present invention provides a transverse ultra-thin IGBT having current density. The present invention solves the problem of low current density of an ultra-thin L-IGBT, and increases current density without reducing a breakdown voltage.

Technical Solution

A transverse ultra-thin IGBT having high current density includes: a P substrate, where the P substrate is provided with a buried oxide layer thereon, the buried oxide layer is provided with an N epitaxial layer thereon, the thickness of the N epitaxial layer is 0.1 to 2 μm, the N epitaxial layer is provided with an N well region and a P base region therein, the N well region is provided with an N buffer region therein, the N well region is provided with a field oxide layer thereon, a boundary of the N buffer region abuts against a boundary of the field oxide layer, the N buffer region is provided with a P drain region therein, and the P base region is provided with a first P contact region and an N source region therein, the N epitaxial layer is provided therein with a P base region array including a P annular base region, the P base region array is located between the N well region and the P base region, the P annular base region is provided with a second P contact region and an N annular source region therein, the second P contact region is located in the N annular source region, a first polysilicon gate is disposed on a surface of a boundary region on which the field oxide layer and the N annular source region are adjacent, the first polysilicon gate extends from the boundary of the field oxide layer towards a direction of the N annular source region to a place above the N annular source region, a first gate oxide layer is disposed below an extension region of the first polysilicon gate, a second polysilicon gate is disposed above the N epitaxial layer, a boundary of the second polysilicon gate extends to the place above the N annular source region, another boundary of the second polysilicon gate extends to a place above the N source region, a second gate oxide layer is disposed below the second polysilicon gate, a dielectric isolation oxide layer is disposed on the field oxide layer, the first polysilicon gate, the second polysilicon gate, the P base region, the P annular base region, the first P contact region, the N source region, the second P contact region, the N annular source region, the N buffer region, and the P drain region, an emitter metal wire is connected to the first P contact region, the N source region, the second P contact region, and the N annular source region, a collector metal wire is connected to the P drain region, and a gate metal wire is connected to the first polysilicon gate and the second polysilicon gate.

Advantageous Effect

Compared with the prior art, the present invention has the following advantages:

The transverse ultra-thin IGBT having high current density of the present invention uses a new structure, that is, the N epitaxial layer (3) is provided therein with the P base region array (17) including the P annular base region (6b), and the P base region array (17) is located between the N well region (4) and the P base region (6a). Compared with a conventional transverse ultra-thin IGBT (FIG. 3) having only one P base region, the present invention achieves that after a gate voltage increases constantly, a depletion layer first occurs below the gate oxide layers of the P base region (6a) and the P annular base region (6b), and after the gate voltage reaches a threshold voltage, an inversion layer occurs below the gate oxide layers of the P base region (6a) and the P annular base region (6b), which is equivalent to addition of a conducting channel of a parasitic NMOS transistor in the transverse ultra-thin IGBT, that is, increase of a current of the parasitic NMOS transistor. As shown in FIG. 1, the N epitaxial layer (3) in the x direction and the y direction further can provide a current flow path, and thus the current of the parasitic NMOS transistor can be used as a base region current of a PNP transistor in the transverse ultra-thin IGBT, so that an electro hole collecting capability is added to the first P contact region (7a) and the second P contact region (7b) of the P base region (6a) and the P annular base region (6b). Finally, current density of the transverse ultra-thin IGBT is improved.

(2) Because the P base region (6a) and the P base region array (17) including the P annular base region (6b) cause increase of a quantity of conducting channels, compared with the conventional transverse ultra-thin IGBT having high current density of the present invention has higher current density under the condition of a same withstand voltage, or has a higher withstand voltage under the condition of same current density.

(3) The transverse ultra-thin IGBT having high current density of the present invention is totally based on an existing transverse ultra-thin IGBT manufacturing process, no additional process step is added, and manufacturing is simple.

DETAILED DESCRIPTION OF THE INVENTION

Figure 1:
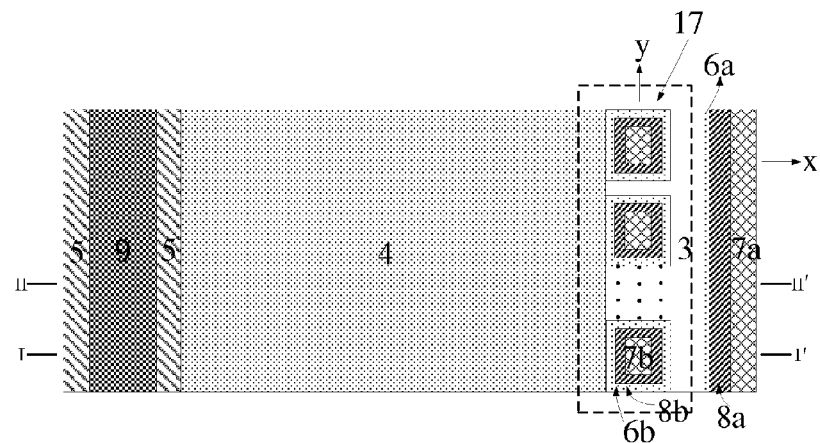
FIG. 1 is a schematic diagram of a transverse ultra-thin IGBT having high current density according to the present invention.
Figure 2:
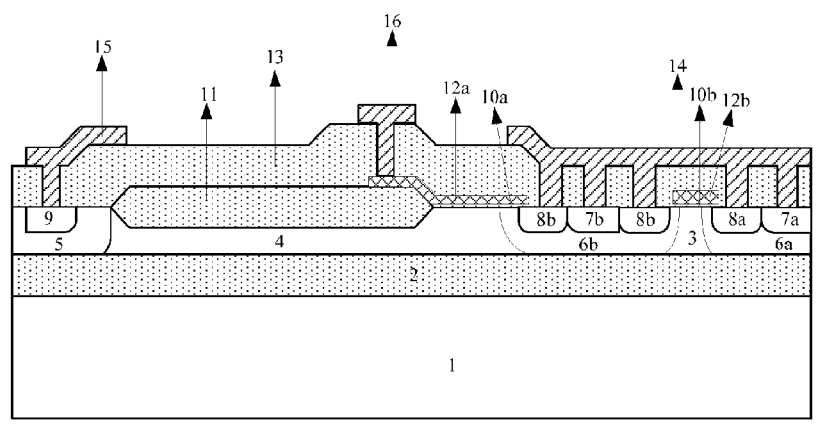
FIG. 2 is a transverse sectional view along I-I' line in FIG. 1.
Figure 3:
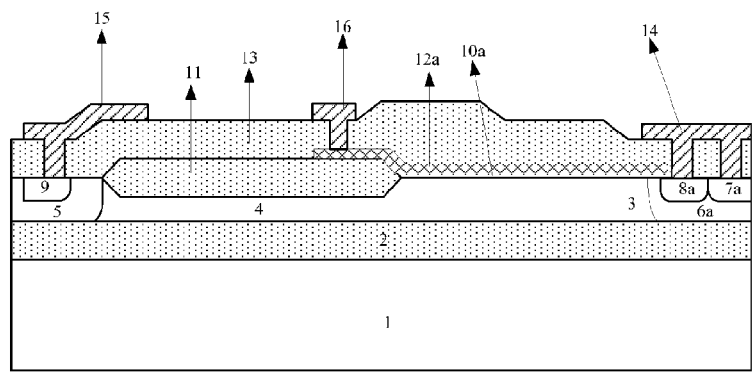
FIG. 3 is a transverse sectional view along II-II' line in FIG. 1.
Figure 4:
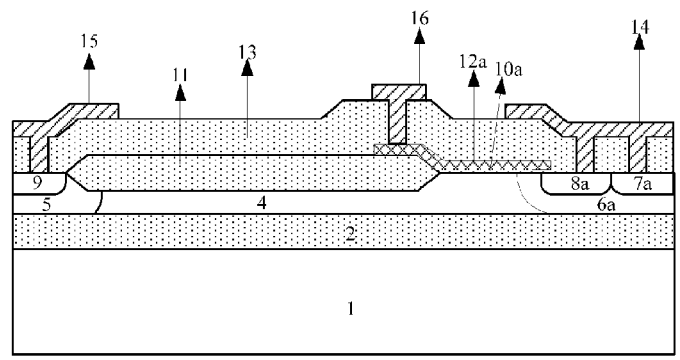
FIG. 4 is a transverse sectional view of a structure of a conventional transverse ultra-thin IGBT.
Figure 5:
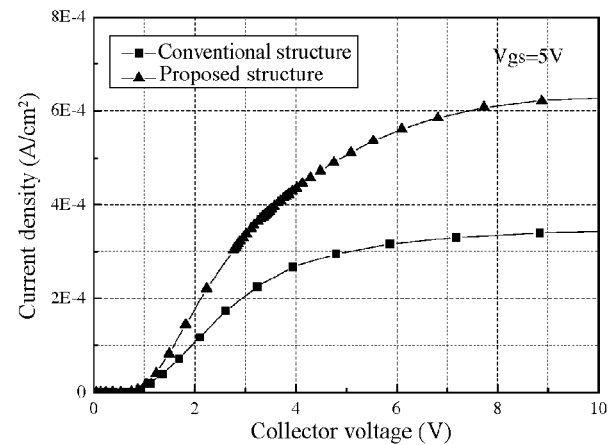
FIG. 5 is a diagram of comparison between current density of a transverse ultra-thin IGBT having high current density (proposed structure) according to the present invention and a conventional transverse ultra-thin IGBT (conventional structure)

Referring to FIG. 1, FIG. 2, and FIG. 3, a transverse ultra-thin IGBT having high current density includes: a P substrate 1, where the P substrate 1 is provided with a buried oxide layer 2 thereon, the buried oxide layer 2 is provided with an N epitaxial layer 3 thereon, the thickness of the N epitaxial layer 3 is 0.1 to 1.5 μm, the N epitaxial layer 3 is provided with an N well region 4 and a P base region 6a therein, the N well region 4 is provided with an N buffer region 5 therein, the N well region 4 is provided with a field oxide layer 11 thereon, a boundary of the N buffer region 5 abuts against a boundary of the field oxide layer 11, the N buffer region 5 is provided with a P drain region 9 therein, and the P base region 6a is provided with a first P contact region 7a and an N source region 8a therein, the N epitaxial layer 3 is provided therein with a P base region array 17 including a P annular base region 6b, the P base region array 17 is located between the N well region 4 and the P base region 6a, the P annular base region 6b is provided with a second P contact region 7b and an N annular source region 8b therein, the second P contact region 7b is located in the N annular source region 8b, a first polysilicon gate 12a is disposed on a surface of a boundary region on which the field oxide layer 11 and the N annular source region 8b are adjacent, the first polysilicon gate 12 extends from the boundary of the field oxide layer 11 towards a direction of the N annular source region 8b to a place above the N annular source region 8b, a first gate oxide layer 10a is disposed below an extension region of the first polysilicon gate 12a, a second polysilicon gate 12b is disposed above the N epitaxial layer 3, a boundary of the second polysilicon gate 12b extends to the place above the N annular source region 8b, another boundary of the second polysilicon gate 12b extends to a place above the N source region 8a, a second gate oxide layer 10b is disposed below the second polysilicon gate 12b, a dielectric isolation oxide layer 13 is disposed on the field oxide layer 11, the first polysilicon gate 12a, the second polysilicon gate 12b, the P base region 6a, the P annular base region 6b, the first P contact region 7a, the N source region 8a, the second P contact region 7b, the N annular source region 8b, the N buffer region 5, and the P drain region 9, an emitter metal wire 14 is connected to the first P contact region 7a, the N source region 8a, the second P contact region 7b, and the N annular source region 8b, a collector metal wire 15 is connected to the P drain region 9, and a gate metal wire 16 is connected to the first polysilicon gate 12a and the second polysilicon gate 12b.

The P base region array 17 may have multiple lines and multiple columns, and may also have multiple lines and a single line. In this embodiment, a P base region array has one column is selected as the P base region array 17 including the P annular base region 6b, of which a line quantity is not limited, which may be 2, 3, . . . , 10 or more as long as it is ensured that a spacing between adjacent boundaries of P annular base regions is not changed, that is, a path region on which a current can flow is not changed. Current density is little affected by increase of the line quantity of the P base region array 17 including the P annular base region 6b.

Figure 6:
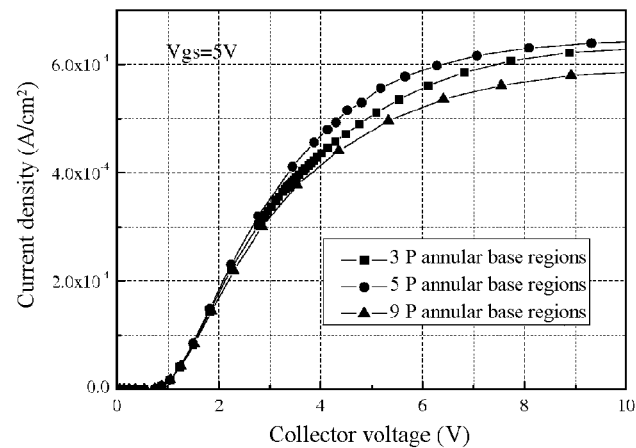
FIG. 6 is a diagram of comparison between current density after increase of a line quantity of a P base region array including a P annular base region of a transverse ultra-thin IGBT having high current density according to the present invention.

Refer to FIG. 6 for a diagram of comparison between current density after the increase of the line quantity of the P base region array 17 including the P annular base region 6b.

Figure 7:
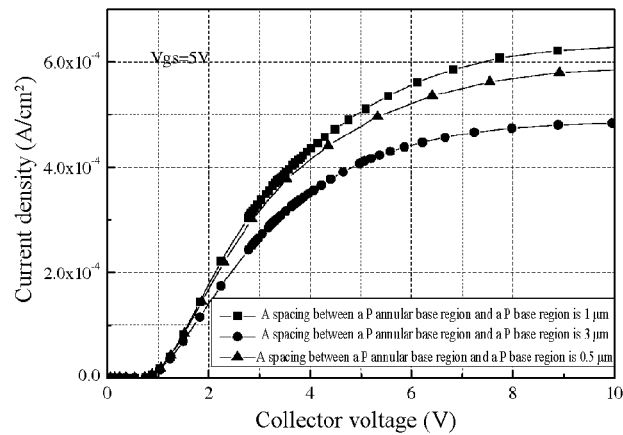
FIG. 7 is a diagram of comparison between current density after change of a spacing between a P base region and a P annular base region of a transverse ultra-thin IGBT having high current density according to the present invention.

In this embodiment, the current density may be further improved by using the following technical measures:

(1) A spacing between adjacent boundaries of the P base region (6a) and the P annular base region (6b) is 0.5 to 3 μm. If the spacing between the adjacent boundaries of the P base region (6a) and the P annular base region (6b) is less than 0.5 μm, a region on which a current can flow is excessively small, the current density can be improved but the effect is not obvious. If the spacing between the adjacent boundaries of the P base region (6a) and the P annular base region (6b) is greater than 3 μm, a current flow path is excessively long, and the current density can also be improved but the effect is not obvious. Refer to FIG. 7 for a diagram of comparison between current density after change of the spacing between the adjacent boundaries of the P base region (6a) and the P annular base region (6b).

Figure 8:
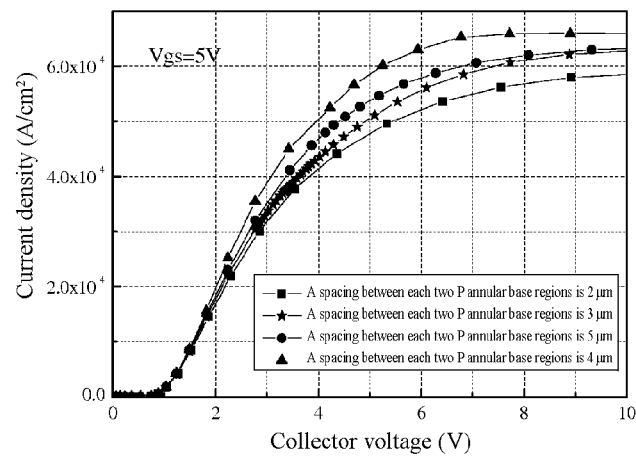
FIG. 8 is a diagram of comparison between current density after change of a spacing between adjacent boundaries of adjacent P annular base regions of a transverse ultra-thin IGBT having high current density according to the present invention.

(2) A spacing between adjacent boundaries of adjacent P annular base regions is 1 to 6 μm. If the spacing between the adjacent boundaries of the adjacent P annular base regions is less than 1 μm, a region on which a current can flow is excessively small, the current density can be improved but the effect is not obvious. If the spacing between the adjacent boundaries of the adjacent P annular base regions is greater than 6 μm, and the current density can also be improved but the effect is not obvious. Refer to FIG. 8 for a diagram of comparison between current density after change of the spacing between the adjacent boundaries of the adjacent P annular base regions.

The present invention uses the following method for manufacturing:

1. Select and clean a P silicon substrate, deposit an oxide layer, then perform epitaxy, silicon nitride deposition, photo etching, and ion implantation to phosphorous to generate an N well region, and perform annealing, silicon nitride removal, photo etching, and ion implantation to boron to generate a P base region and a P annular base region.

2. Implant ions to arsenic and phosphorous to generate an N buffer region, perform silicon nitride deposition and photo etching to form an active region, etch silicon nitride, then perform field oxide growth and field implantation, adjust a channel threshold voltage, then perform gate oxide layer growth, deposit and etch polysilicon to form a first polysilicon gate, a second polysilicon gate, and a polysilicon field plate, perform source and drain implantation to form an N source region, an N annular source region, a first P contact region, a second P contact region, and a P drain region, and then deposit a field oxide layer.

3. Etch the field oxide layer to form metal electrode lead-out holes of the N source region, the N annular source region, the first P contact region, the second P contact region, the first polysilicon gate, the second polysilicon gate, and the P drain region, deposit a metal layer, and etch the metal layer to form lead-out electrodes of the N source region, the N annular source region, the first P contact region, and the second P contact region of the transverse ultra-thin IGBT, lead-out electrodes of the first polysilicon gate and the second polysilicon gate, and a lead-out electrode of the P drain region. Finally, perform passivation processing.

What is claimed is:

1. A transverse ultra-thin insulated gate bipolar transistor having high current density, comprising: a P substrate (1), wherein the P substrate (1) is provided with a buried oxide layer (2) thereon, the buried oxide layer (2) is provided with an N epitaxial layer (3) thereon, the thickness of the N epitaxial layer (3) is 0.1 to 1.5 μm, the N epitaxial layer (3) is provided with an N well region (4) and a P base region (6a) therein, the N well region (4) is provided with an N buffer region (5) therein, the N well region (4) is provided with a field oxide layer (11) thereon, a boundary of the N buffer region (5) abuts against a boundary of the field oxide layer (11), the N buffer region (5) is provided with a P drain region (9) therein, and the P base region (6a) is provided with a first P contact region (7a) and an N source region (8a) therein, wherein the N epitaxial layer (3) is provided therein with a P base region array (17) comprising a P annular base region (6b), the P base region array (17) is located between the N well region (4) and the P base region (6a), the P annular base region (6b) is provided with a second P contact region (7b) and an N annular source region (8b) therein, the second P contact region (7b) is located in the N annular source region (8b), a first polysilicon gate (12a) is disposed on a surface of a boundary region on which the field oxide layer (11) and the N annular source region (8b) are adjacent, the first polysilicon gate (12) extends from the boundary of the field oxide layer (11) towards a direction of the N annular source region (8b) to a place above the N annular source region (8b), a first gate oxide layer (10a) is disposed below an extension region of the first polysilicon gate (12a), a second polysilicon gate (12b) is disposed above the N epitaxial layer (3), a boundary of the second polysilicon gate (12b) extends to the place above the N annular source region (8b), another boundary of the second polysilicon gate (12b) extends to a place above the N source region (8a), a second gate oxide layer (10b) is disposed below the second polysilicon gate (12b), a dielectric isolation oxide layer (13) is disposed on the field oxide layer (11), the first polysilicon gate (12a), the second polysilicon gate (12b), the P base region (6a), the P annular base region (6b), the first P contact region (7a), the N source region (8a), the second P contact region (7b), the N annular source region (8b), the N buffer region (5), and the P drain region (9), an emitter metal wire (14) is connected to the first P contact region (7a), the N source region (8a), the second P contact region (7b), and the N annular source region (8b), a collector metal wire (15) is connected to the P drain region (9), and a gate metal wire (16) is connected to the first polysilicon gate (12a) and the second polysilicon gate (12b).

2. The transverse ultra-thin insulated gate bipolar transistor having high current density according to claim 1, wherein the P base region array (17) comprising the P annular base region (6b) is a P base region array having one column.

3. The transverse ultra-thin insulated gate bipolar transistor having high current density according to claim 1, wherein the P annular base region (6b) is hexagonal, quadrilateral, or circular.

4. The transverse ultra-thin insulated gate bipolar transistor having high current density according to claim 1, wherein a spacing between adjacent boundaries of the P base region (6a) and the P annular base region (6b) is 0.5 to 3 μm.

5. The transverse ultra-thin insulated gate bipolar transistor having high current density according to claim 1, wherein a spacing between adjacent boundaries of adjacent P annular base regions (6b) is 1 to 6 μm.

6. The transverse ultra-thin insulated gate bipolar transistor having high current density according to claim 2, wherein the P annular base region (6b) is hexagonal, quadrilateral, or circular.

* * * * *